United States Patent
Sjöland

(10) Patent No.: US 11,909,372 B2
(45) Date of Patent: Feb. 20, 2024

(54) DIFFERENTIAL COMBINER CIRCUIT

(71) Applicant: Telefonaktiebolaget LM Ericsson (publ), Stockholm (SE)

(72) Inventor: Henrik Sjöland, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 397 days.

(21) Appl. No.: 17/426,252

(22) PCT Filed: Feb. 14, 2019

(86) PCT No.: PCT/EP2019/053628
§ 371 (c)(1),
(2) Date: Jul. 28, 2021

(87) PCT Pub. No.: WO2020/164707
PCT Pub. Date: Aug. 20, 2020

(65) Prior Publication Data
US 2022/0109418 A1 Apr. 7, 2022

(51) Int. Cl.
*H04B 1/40* (2015.01)
*H03H 7/46* (2006.01)
(Continued)

(52) U.S. Cl.
CPC ............... *H03H 7/463* (2013.01); *H01P 5/16* (2013.01); *H04B 1/40* (2013.01); *H04L 5/14* (2013.01)

(58) Field of Classification Search
CPC .. H03H 7/463; H01P 5/16; H04B 1/40; H04L 5/14
See application file for complete search history.

(56) References Cited

U.S. PATENT DOCUMENTS

2002/0171508 A1* 11/2002 Harada ................. H03H 7/463
333/133
2004/0180633 A1 9/2004 Nakatani et al.
(Continued)

FOREIGN PATENT DOCUMENTS

CN 101803215 A 8/2010

OTHER PUBLICATIONS

Ud Din, I., et al., "Two Tunable Frequency Duplexer Architectures for Cellular Transceivers", IEEE Transactions on Circuits and Systems I: Regular Papers, Jun. 7, 2017, pp. 1-12, XP055451399.
(Continued)

*Primary Examiner* — Fahmida S Chowdhury
(74) *Attorney, Agent, or Firm* — COATS & BENNETT, PLLC

(57) ABSTRACT

A differential combiner circuit (200) comprises three ports each has two terminals (1a, 1b, 2a, 2b, 3a, 3b). The differential combiner circuit (200) further comprises a first sub-circuit comprising a first inductor (L1) connected between the first terminals (1a, 2a) of the first and second ports, and a first capacitor (C1) connected between the first terminals (2a, 3a) of the second and third ports; a second sub-circuit comprising a second inductor (L2) connected between the second terminals (1b, 2b) of the first and second ports, and a second capacitor (C2) connected between the second terminals (2b, 3b) of the second and third ports. The differential combiner circuit (200) further comprises a third capacitor (C3) connected between the first and second terminals (1a, 1b) of the first port, a third inductor (L3) connected between the first and second terminals (3a, 3b) of the third port; a first resistor (R1) connected between the first terminal (1a) of the first port and the second terminal (3b) of the third port; and a second resistor (R2) connected between (Continued)

the second terminal (1b) of the first port and the first terminal (3a) of the third port.

18 Claims, 9 Drawing Sheets

(51) Int. Cl.
  *H01P 5/16* (2006.01)
  *H04L 5/14* (2006.01)

(56) References Cited

U.S. PATENT DOCUMENTS

| | | | | |
|---|---|---|---|---|
| 2007/0229189 | A1* | 10/2007 | Iwata | H03H 7/463 |
| | | | | 333/133 |
| 2009/0068963 | A1 | 3/2009 | Cabanillas et al. | |
| 2009/0185512 | A1* | 7/2009 | Hayakawa | H03H 7/463 |
| | | | | 455/82 |
| 2009/0268647 | A1* | 10/2009 | Uejima | H03H 7/463 |
| | | | | 370/297 |
| 2011/0064004 | A1 | 3/2011 | Mikhemar et al. | |
| 2013/0335291 | A1* | 12/2013 | Judson | H04B 1/18 |
| | | | | 343/861 |
| 2014/0210542 | A1* | 7/2014 | Chang | H03F 1/0294 |
| | | | | 327/355 |
| 2017/0010360 | A1* | 1/2017 | Sokolov | G01S 19/21 |
| 2019/0214700 | A1* | 7/2019 | Wang | H01P 1/36 |
| 2020/0072882 | A1* | 3/2020 | Adamski | G01R 25/02 |
| 2021/0210442 | A1* | 7/2021 | Dalmia | H01L 23/49838 |
| 2022/0059920 | A1* | 2/2022 | Yoon | H01P 5/16 |
| 2022/0140462 | A1* | 5/2022 | Sugawara | H01P 5/184 |
| | | | | 333/116 |
| 2022/0393650 | A1* | 12/2022 | Ayranci | H03F 1/223 |

OTHER PUBLICATIONS

Abdelhalem, S., et al., "Hybrid Transformer-Based Tunable Differential Duplexer in a 90-nm CMOS Process", IEEE Transactions on Microwave Theory and Techniques, Mar. 1, 2013, pp. 1316-1326, vol. 61, No. 3, Plenum, USA, XP011495200.

* cited by examiner

DIFFERENTIAL COMBINER CIRCUIT

TECHNICAL FIELD

Embodiments herein relate to differential combiner circuits. In particular, they relate to differential combiner circuits for full duplex or flexible frequency division duplex transceivers.

BACKGROUND

Wireless communication devices usually comprise transceivers comprising transmitter and receiver circuits. The transmitter circuits typically up-convert baseband signals to Radio Frequency (RF) signals for transmission, and the receiver circuits down-convert received RF signals to baseband signals for further processing.

There are large benefits in communication devices being able to receive and transmit signals simultaneously, at the same frequency or at different frequencies. Preferably the antenna should be shared between the receiver and transmitter. A communication system may then become more flexible in its operation, not having to schedule reception and transmission to occur at different times, and response delays could be reduced. Simultaneous transmission and reception at the same frequency is often referred to as full duplex, whereas using different frequencies is typically referred to as frequency division duplex (FDD). Full duplex has an advantage of increased spectrum efficiency, being able to use the same frequency simultaneously in both uplink and downlink. However, it is extremely challenging to achieve sufficient isolation between transmitter and receiver when there is a large power ratio between the signal to transmit and receive. This makes full duplex less suitable in long-range systems where the ratio may be very large when the communication device is far away from a base-station. FDD on the other hand is used in relatively long-range systems like Long Term Evolution (LTE) telecommunications networks. Then a set of fixed filters, a so-called duplexer, is used in each frequency band, to separate receive and transmit signals. A duplexer can have low loss and still provide high isolation. For that to be possible, the two signals must be sufficiently separated in frequency, and the signals are thus typically located apart at the so called duplex distance, and it is fixed which signal is at the lower frequency and which is at the higher. The use of duplex filters thus makes frequency usage in a band inflexible. Since one duplexer per frequency band is required, band usage also becomes inflexible. Further the number of bands to support will be limited by the cost and physical size of the duplex filters.

So duplex filters provide high performance but have very little flexibility. The frequencies for receive and transmit signals must be separated by the duplex distance. The filters provide a fixed frequency range for transmit signals and a fixed frequency range for receive signals. It will thus not be possible to use a duplex filter in an application where the receive and transmit frequencies are randomly hopping over the frequency band, like in Bluetooth. Further, since the duplexer functionality is based on having a frequency distance between the receive and transmit signals, it is fundamentally incompatible with full duplex usage. Added to this is the problem of a growing number of frequency bands to cover in mobile phones, requiring a growing number of large and costly duplexers.

If filters cannot be used to isolate the receiver and the transmitter, due to poor flexibility, different types of isolating combiners may be used. The main drawback is that these isolating combiners have an inherent 3 dB insertion loss. The isolating combiners are usually based on cancellation principle, and built using resistors combined with circuit elements like transmission lines and transformers. For instance, in US20110064004, electrical balance isolators are disclosed which use a transformer and a dummy load. When the dummy load perfectly matches an antenna impedance there is symmetry in the isolators and perfect isolation is obtained. The drawback is that a transformer is needed, with associated losses. The realization of a dummy load that is fully programmable with both inductive and capacitive impedance over the desired range of frequencies is also a major issue. Another option is to use a Wilkinson combiner, which may be used to provide some flexibility with different modes of operation. This combiner, however, requires two quarter wave transmission lines to be implemented. The transmission lines are also difficult to tune to other center frequencies. How to preserve the isolation and compensate for antenna impedance variations, inductive as well as capacitive, is also an open question.

SUMMARY

Therefor it is an object of embodiments herein to provide an isolator circuit with improved performance.

According to one aspect of embodiments herein, the object is achieved by a differential combiner circuit. The differential combiner circuit comprises a first port having a first terminal and a second terminal; a second port having a first terminal and a second terminal; and a third port having a first terminal and a second terminal.

The differential combiner circuit further comprises a first sub-circuit comprising a first inductor connected between the first terminals of the first and second ports, and a first capacitor connected between the first terminals of the second and third ports.

The differential combiner circuit further comprises a second sub-circuit comprising a second inductor connected between the second terminals of the first and second ports, and a second capacitor connected between the second terminals of the second and third ports.

The differential combiner circuit further comprises a third capacitor connected between the first and second terminals of the first port, and a third inductor connected between the first and second terminals of the third port.

The differential combiner circuit further comprises a first resistor connected between the first terminal of the first port and the second terminal of the third port, and a second resistor connected between the second terminal of the first port and the first terminal of the third port.

In other words, a differential combiner circuit according to the embodiments herein is realized with a core of three inductors, three capacitors and two resistors. In the differential combiner circuit, two balun structures are formed. The first balun comprises the first sub-circuit and a half of the third capacitor with twice the capacitance and a half of the third inductor with half of the inductance. The second balun comprises the second sub-circuit and a half of the third capacitor with twice the capacitance and a half of the third inductor with half of the inductance. The second port of the differential combiner circuit may serve as an antenna port coupled to an antenna. The first port of the differential combiner circuit may serve as a receive port coupled to a receiver and the third port of the differential combiner circuit may serve as a transmit port coupled to a transmitter or vice versa. Therefore, the two baluns are connected differentially to the antenna port and the two resistors are cross-coupled between the two baluns.

The differential combiner circuit according to the embodiments herein provides high isolation between the receive and transmit ports for signals centred at the LC resonance frequency of the circuit. This is due to a cancellation between two paths, one through the sub-circuit with LC-structure and one through the cross coupled resistors. The cross coupled resistors have a function of isolation resistors.

The differential combiner circuit according to the embodiments herein provides wide bandwidth, avoids use of transmission lines and transformers, and does not require a dummy load with programmable inductance. Despite its simplicity and low component count it supports fully differential circuitry, and it provides high isolation between receiver and transmitter. The differential combiner circuit is suitable for full integration as an on-chip isolator and provides low additional loss with low quality factor on-chip inductors. With an on-chip isolator like this, it becomes feasible to introduce full duplex or flexible frequency division duplex in low-cost short-range transceivers.

Therefore, the differential combiner circuit according to embodiments herein provides an improved isolator circuit for full duplex or flexible frequency division duplex transceivers.

BRIEF DESCRIPTION OF THE DRAWINGS

Examples of embodiments herein are described in more detail with reference to attached drawings in which.

DETAILED DESCRIPTION

Figure 1:
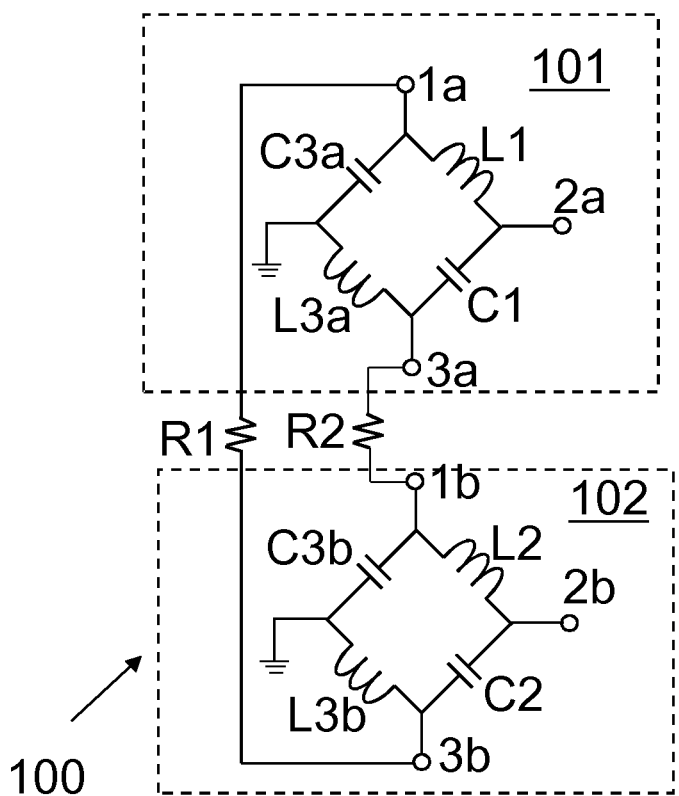
FIG. 1 is a schematic view of a differential combiner circuit according to a first embodiment herein.

FIG. 1 shows a differential combiner circuit 100 according to a first embodiment herein.

The differential combiner circuit 100 comprises two baluns 101 and 102. Each balun has a lattice structure with two inductors and two capacitors, and each balun has three terminals. The first balun 101 has two inductors L1 and L3a, two capacitors C1 and C3a, a first terminal 1a, a second terminal 2a, a third terminal 3a. The second balun 102 has two inductors L2 and L3b, two capacitors C2 and C3b, a first terminal 1b, a second terminal 2b, a third terminal 3b. In each balun, between the first terminal and a signal ground is a capacitor C3a/C3b, between the first and second terminals is an inductor L1/L2, between the second and third terminals is a capacitor C1/C2, and between the third terminal and the signal ground is an inductor L3a/L3b.

The first terminals 1a, 1b of the first and second baluns form a first port of the differential combiner circuit 100.

The second terminals 2a, 2b of the first and second baluns form a second port of the differential combiner circuit 100.

The third terminals 3a, 3b of the first and second baluns form a third port of the differential combiner circuit 100.

The differential combiner circuit 100 further comprises two resistors R1 and R2, each connected between the first terminal 1a/1b of one balun and the third terminal 3b/3a of the other, i.e. they are cross-coupled.

Figure 2:
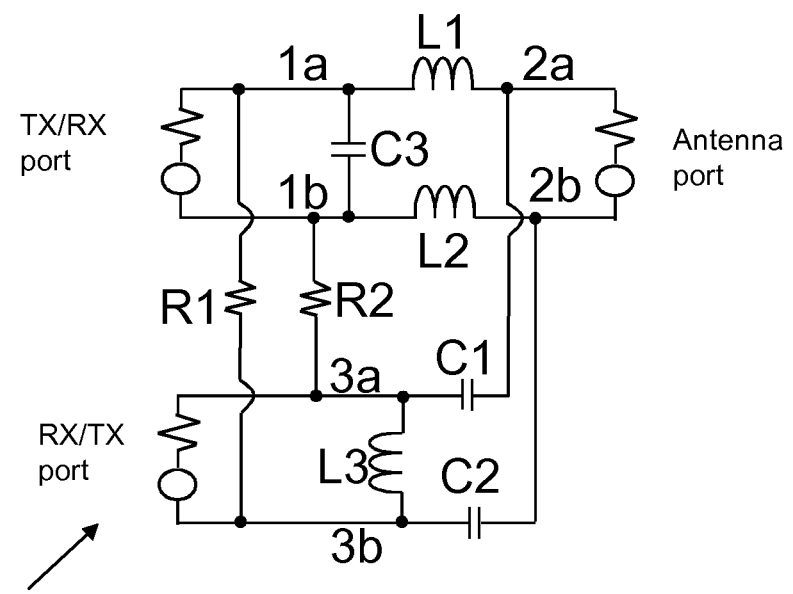
FIG. 2 is a schematic view of a differential combiner circuit according to a second embodiment herein.

Since the two baluns 101, 102 will be driven with differential signals at all ports of the differential combiner circuit 100, the two capacitors C3a, C3b to signal ground may be replaced by a single capacitor C3 with half the value between the first terminals 1a, 1b of the two baluns, and the two inductors L3a, L3b to the signal ground may be replaced in the same way with an inductor L3 with twice of the value between the third terminals 3a, 3b of the two baluns. FIG. 2 shows such a differential combiner circuit 200 according to a second embodiment herein.

The differential combiner circuit 200 comprises a first port having a first terminal 1a and a second terminal 1b; a second port having a first terminal 2a and a second terminal 2b; and a third port having a first terminal 3a and a second terminal 3b.

The differential combiner circuit 200 further comprises a first sub-circuit comprising a first inductor L1 connected between the first terminals 1a, 2a of the first and second ports, and a first capacitor C1 connected between the first terminals 2a, 3a of the second and third ports.

The differential combiner circuit 200 further comprises a second sub-circuit comprising a second inductor L2 connected between the second terminals 1b, 2b of the first and second ports, and a second capacitor C2 connected between the second terminals 2b, 3b of the second and third ports.

The differential combiner circuit 200 further comprises a third capacitor C3 connected between the first and second terminals 1a, 1b of the first port, and a third inductor L3 connected between the first and second terminals 3a, 3b of the third port.

The differential combiner circuit 200 further comprises a first resistor R1 connected between the first terminal 1a of the first port and the second terminal 3b of the third port, and a second resistor R2 connected between the second terminal 1b of the first port and the first terminal 3a of the third port.

As can be seen, the differential combiner circuit 200 according to the embodiments herein is implemented with a core of three inductors, three capacitors and two resistors. In the differential combiner circuit 200, two balun structures are formed. The first balun comprises the first sub-circuit with L1, C1, and a half of the third capacitor C3 with twice of the capacitance and a half of the third inductor L3 with half of the inductance. The second balun comprises the second sub-circuit with L2, C2, and a half of the third capacitor C3 with twice of the capacitance and a half of the third inductor L3 with half of the inductance. The second port of the differential combiner circuit 200 may serve as an antenna port coupled to an antenna. The first port of the differential combiner circuit 200 may serve as a receive RX port coupled to a receiver and the third port of the differential combiner circuit 200 may serve as a transmit TX port coupled to a transmitter or vice versa. Therefore, the two baluns are connected differentially to the antenna port and the two resistors are cross-coupled between the two baluns.

All inductors L1, L2, L3a, L3b and capacitors C1, C2, C3a, C3b in the differential combiner circuit 100, 200 may be given with equal inductance and capacitance values, e.g. an inductance value of L and a capacitance value of C. For the third capacitor C3 which is the combined of the two capacitors C3a, C3b, half of the capacitance value C, and for the third inductor L3 which is the combined of the two inductors L3a, L3b, twice of the inductance value L.

The differential combiner circuit 200 will provide high isolation centered at the resonance frequency=$1/(2\pi\sqrt{LC})$. Its frequency of operation is not offset from the LC resonance, like in an L-match circuit, i.e. a matching network containing one inductor and one capacitor constructed in the shape of an L, where the offset depends on a circuit quality Q-value. The Q-value for all ports to be matched to a same port resistance is equal to $1/\text{sqrt}(2)$, and this low Q-value will inherently provide wideband operation. According to some embodiments, the two cross-coupled resistors R1, R2 should each have a value $R_{iso}$ equal to the differential port impedance for optimum isolation. However, other values may provide sufficient isolation as well, depending on requirements for a given application.

An example circuit has been designed and simulated to verify the functionality and performance of the differential combiner circuit 100, 200. The example circuit was designed with a center frequency of 2 GHz and a differential port impedance Rport of 100Ω. The inductance L is selected as $$L = \frac{R_{port}}{2} \frac{1}{2\pi f Q} = 50 \cdot \frac{\sqrt{2}}{2\pi \cdot 2 \cdot 10^9} = 5.63 \text{ nH} \quad (1)$$

And the capacitance C as $$C = \frac{1}{(2\pi f)^2 \cdot L} = 1.125 \text{ pF} \quad (2)$$

The resistance $R_{iso}$ of the resistors R1 and R2 is selected, to provide optimum isolation, as $$R_{iso} = -R_{port} = -100\Omega \quad (3)$$

The negative resistance is obtained by cross-coupling, see the schematics in FIGS. 1 and 2, where R1 and R2 are cross-coupled resistors for isolation.

Figure 3:
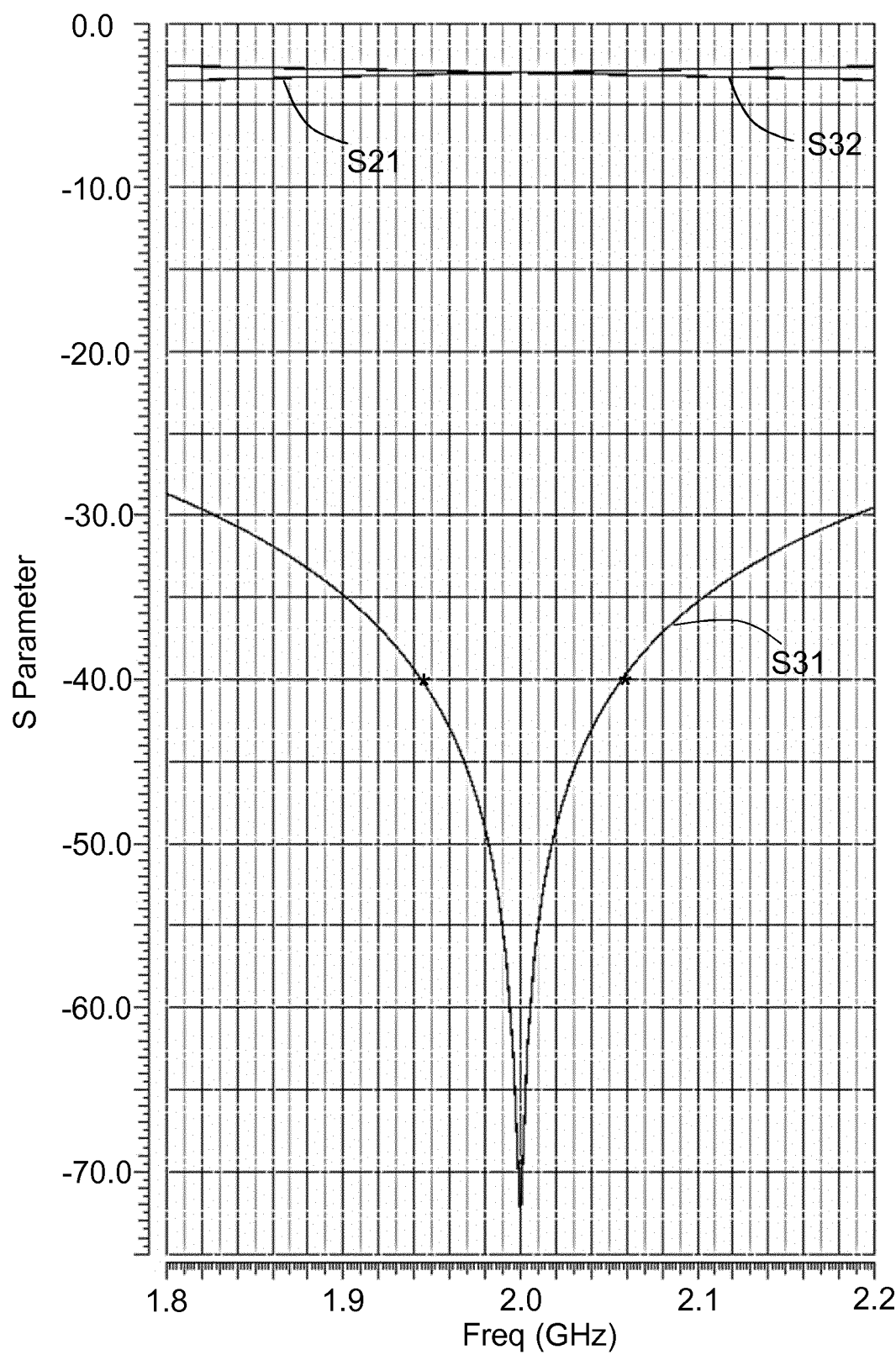
FIG. 3 shows simulation results for the differential combiner circuit according to embodiment herein.

The example circuit has been simulated. FIG. 3 shows the simulated S-parameters, with L1=L2=5.63 nH, C1=C2=1.125 pF, C3=0.5*1.125 pF, and L3=2*5.63 nH, R1=R2=100Ω, $R_{port}$=1000. The S31 curve is the S-parameter for TX and RX ports representing isolation between the TX and RX ports, the S21 curve represents signal transfer from Antenna port to RX port, and the S32 curve represents signal transfer from TX port to Antenna port.

As can be seen a wideband isolation is obtained for this simple circuit. The behavior is as expected with perfect isolation between RX and TX port at 2 GHz, where the losses between TX/RX and antenna port are equal to 3 dB. In a 100 MHz wide band, as indicated by the two star marks, the isolation exceeds 40 dB.

Figure 4:
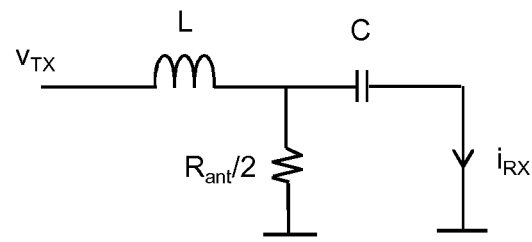
FIG. 4 is a circuit schematic for analysing the differential combiner circuit according to embodiment herein.

The principle of the differential combiner circuit 100, 200 may be explained and analysed with reference to FIG. 4. To analyze the circuit, a transfer from a signal voltage $V_{TX}$ at the transmit port to a current $i_{RX}$ in a short circuited receive port is investigated. The receive port is assumed to be perfectly isolated at the resonance frequency, and hence has no signal voltage, so a short circuit impedance can be used to simplify the analysis.

Circuit analysis shows that at the resonance frequency of L and C, the transfer from $v_{TX}$ to $i_{RX}$ becomes real valued, according to $$i_{RX} = v_{TX} \cdot \frac{R_{ant}}{2} \cdot \frac{C}{L} \quad (4)$$

Where, $R_{ant}$ is antenna impedance. This current should be matched by the current injected by the isolation resistors R1, R2. That current should have an opposite phase, which is realized by the cross-coupling as shown in FIG. 2. The magnitude of the currents should be equal, so $$R_{iso} = -\frac{v_{TX}}{i_{RX}} = -\frac{2L}{C \cdot R_{ant}} \quad (5)$$

With the nominal antenna impedance of 100Ω, the isolation resistance becomes −100Ω. The isolation can also be achieved with other antenna impedances, if the isolation resistance is changed so it is inversely proportional to the antenna impedance as stated by equation (5). For instance, if the antenna impedance is halved to 50Ω the isolation resistance should be doubled to −200Ω.

Figure 5:
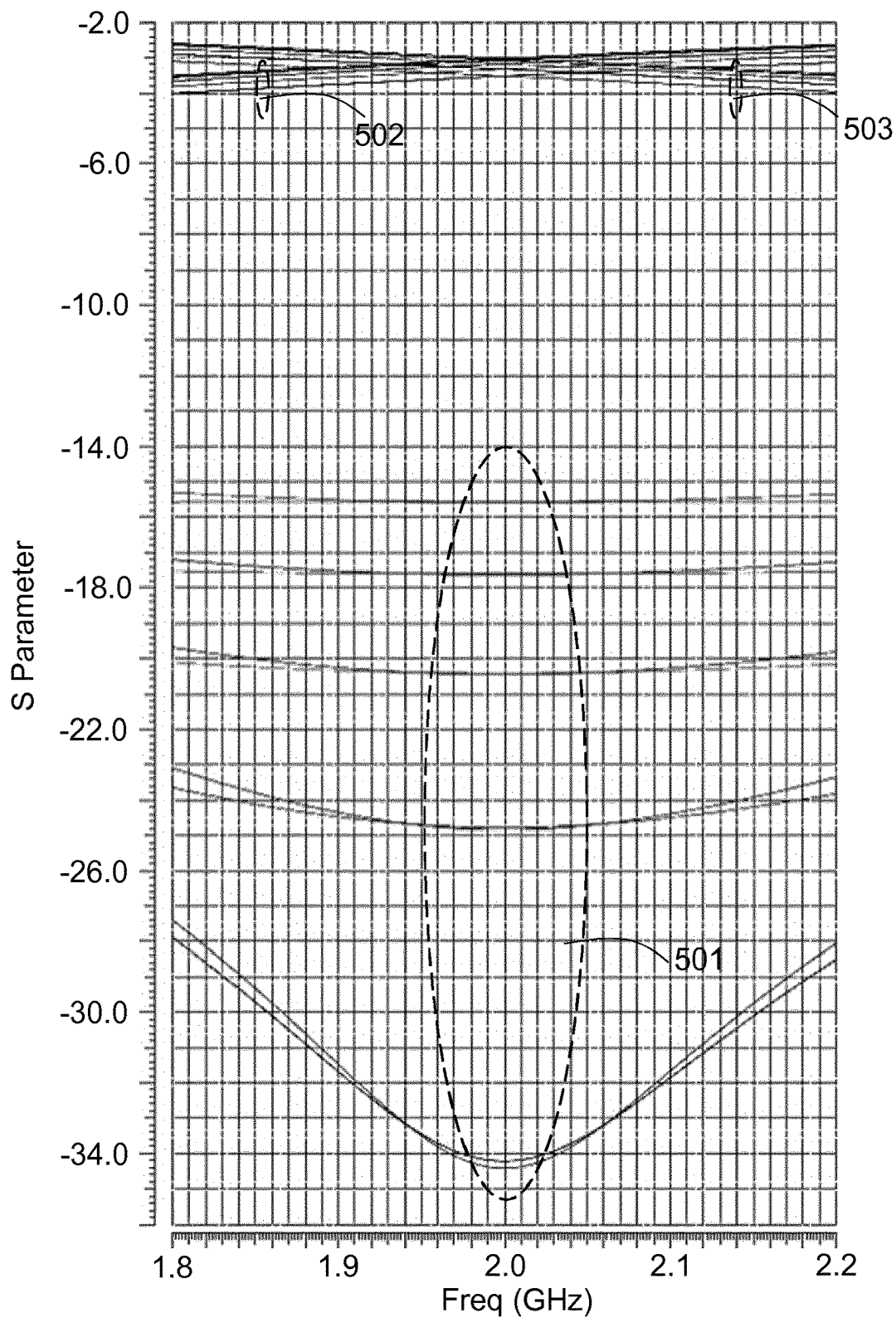
FIG. 5 shows simulation results for the differential combiner circuit according to embodiment herein when antenna impedance varies but isolation resistors kept constant.

FIG. 5 shows a simulation result, where the antenna impedance is swept from 50Ω to 200Ω and the isolation resistance is kept constant at −100Ω. The curves marked by the oval shape 501 are S31 curves for different antenna impedances from 50Ω to 200Ω. The curves marked by the oval shape 502 are S21 curves, and by the oval shape 503 are S32 curves.

Figure 6:
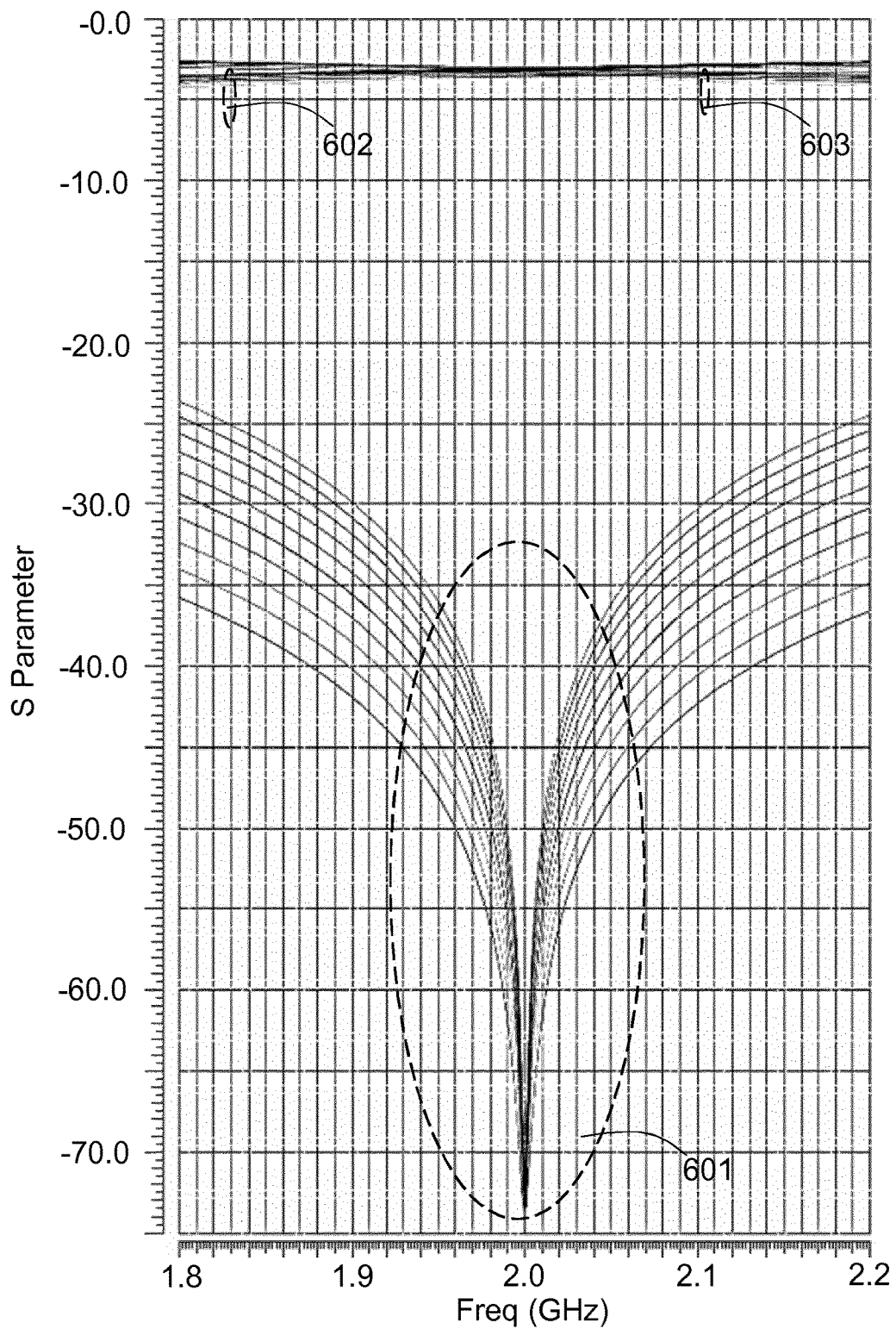
FIG. 6 shows simulation results for the differential combiner circuit according to embodiment herein when antenna impedance varies and isolation resistors also varies.

FIG. 6 shows a simulation result, where the antenna impedance is swept from 50Ω to 200Ω and the isolation resistance is varied according to equation (5). The curves marked by the oval shape 601 are S31 curves for different antenna impedances from 50Ω to 200Ω. The curves marked by the oval shape 602 are S21 curves, and by the oval shape 603 are S32 curves.

As can be seen in FIGS. 5 and 6, the circuit behaves as expected. When setting the isolation resistance according to (5) perfect isolation can be maintained at the resonance frequency although the antenna impedance is changed.

When the antenna impedance has a reactive part, the antenna impedance $R_{ant}$ in FIG. 4 is accompanied by a capacitor or inductor, and the transfer from $v_{TX}$ to $i_{RX}$ will have a phase shift. This phase shifted current can be divided into an in-phase part cancelled by appropriately sized isolation resistors, and a quadrature phase part cancelled by capacitors in parallel with the isolation resistors. Depending on the sign of the antenna reactance the isolation capacitors can be cross-coupled or non-cross-coupled. It will thus be possible to compensate for inductive antenna loads without having to introduce additional inductors in the circuit.

Figure 7:
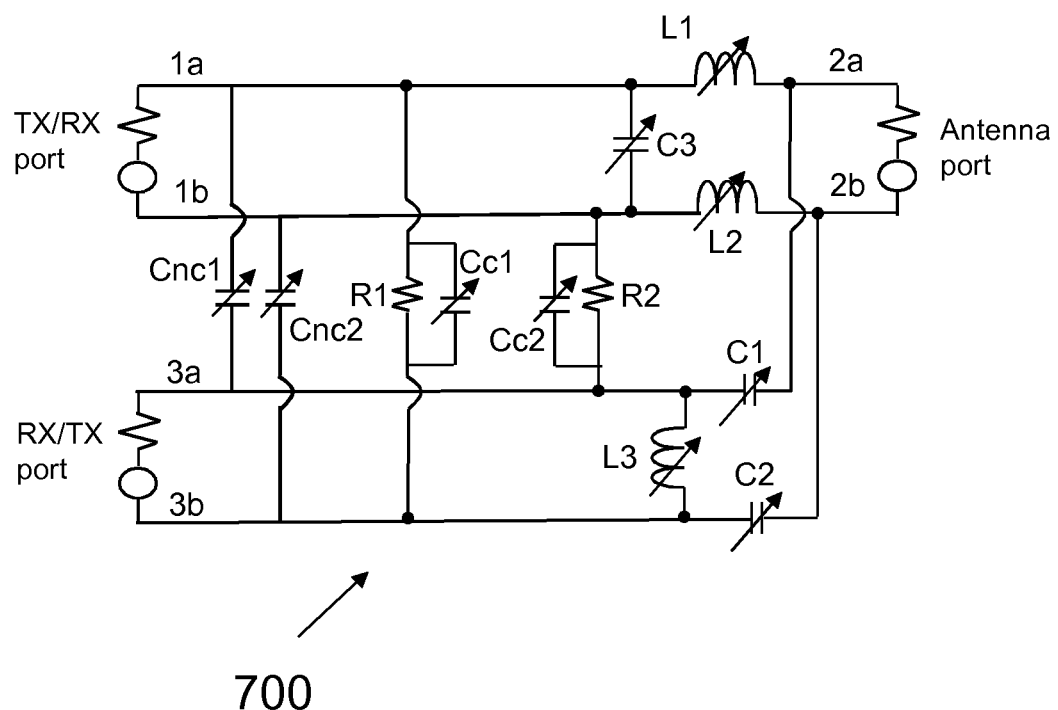
FIG. 7 is a schematic view of a differential combiner circuit according to a third embodiment herein.

FIG. 7 shows a differential combiner circuit 700 according to embodiments herein, where a first and second cross-coupled capacitors Cc1, Cc2 are in parallel with R1 and R2 respectively, a first non-cross-coupled capacitor Cnc1 is connected between the first terminals 1a, 3a of the first and third ports, a second non-cross-coupled capacitor Cnc2 is connected between the second terminals 1b, 3b of the first and third ports. The cross-coupled and non-cross-coupled capacitors are referred herein as isolation capacitors.

Rewriting equation (5) to cover also complex antenna impedances:

$$Z_{iso} = -\frac{v_{TX}}{i_{RX}} = -\frac{2L}{C \cdot Z_{ant}} \quad (6)$$

To verify this, the antenna impedance is swept through the values 100−j40Ω, 100−j20Ω, 100Ω, 100+j20Ω, 100+j40Ω. Using equation (6), the isolation impedance is calculated to have 100Ω cross coupled resistors in parallel with 250Ω, 500Ω, infinity, −500Ω, −250Ω reactance. The reactance at the resonance frequency of 2 GHz is realized by non-cross-coupled capacitors of 318 fF, 159 fF, 0 fF, and cross-coupled capacitors of 159 fF and 318 fF, respectively. As can be seen the effect of antenna reactance is cancelled by a proportional capacitance, cross or non-cross coupled depending on reactance sign. The resistance value is in this case equal to the antenna impedance real part. So for the case when all ports connected to the differential combiner circuit have the same resistance, i.e. the RX, TX and antenna ports have the same nominal resistance, the isolation resistors R1, R2 then have a resistance equal to the port resistance. However, under other operating conditions the antenna impedance will vary around the nominal value, and then the isolation resistors and capacitors may be adjusted to compensate the antenna impedance variation and to maintain the isolation, according to the equations 5 and 6.

Figure 8:
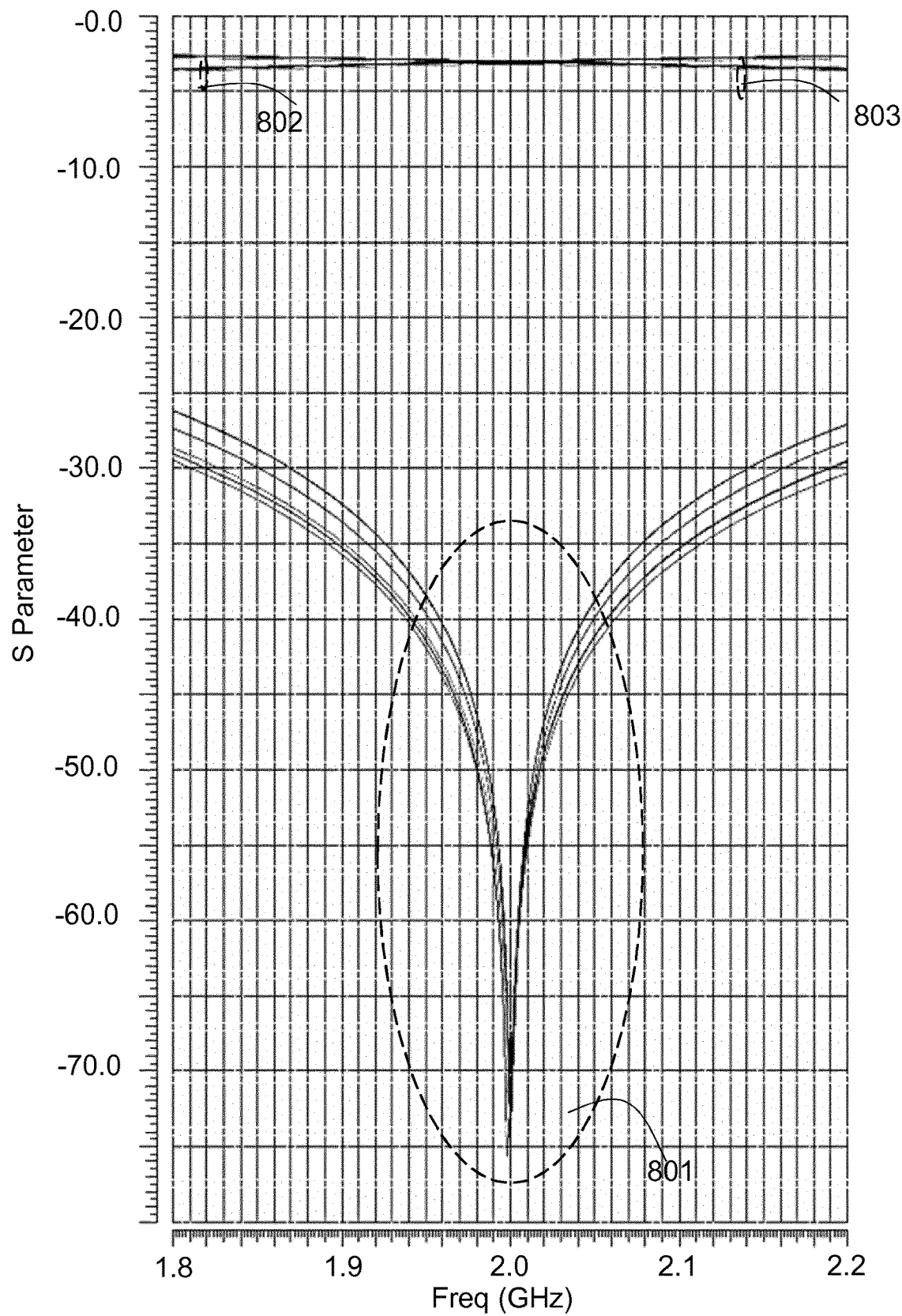
FIG. 8 shows simulation results for the differential combiner circuit according to embodiment herein shown in FIG. 7.

FIG. 8 shows simulation results. As can be seen the circuit behaves as expected and the antenna reactance can be compensated for. The curves marked by the oval shape 801 are S31 curves for different antenna impedances 100−j40Ω, 100−j20Ω, 100Ω, 100+j20Ω, 100+j40Ω. The curves marked by the oval shape 802 are S21 curves, and by the oval shape 803 are S32 curves.

This far the circuit has been simulated using ideal passive components, the loss has been then close to 3 dB. In an actual implementation, especially on an integrated circuit, the inductors will have substantial losses. The quality factor Q of the inductors may then be about 10. It is then important to simulate the circuit with such inductor quality factor Q to see if it lends itself well for integrated circuit implementation, and what performance can be expected. For this purpose, each inductor was connected with a parallel resistor of 1400Ω, and a series resistor of 3.5Ω, corresponding to an inductor Q equal to 10 at 2 GHz. To compensate for the phase shift introduced by the resistive part of the inductors, the isolation capacitors were calculated using a value of j10Ω offset to the antenna impedance. The same sweep as in FIG. 8 is then performed.

Figure 9:
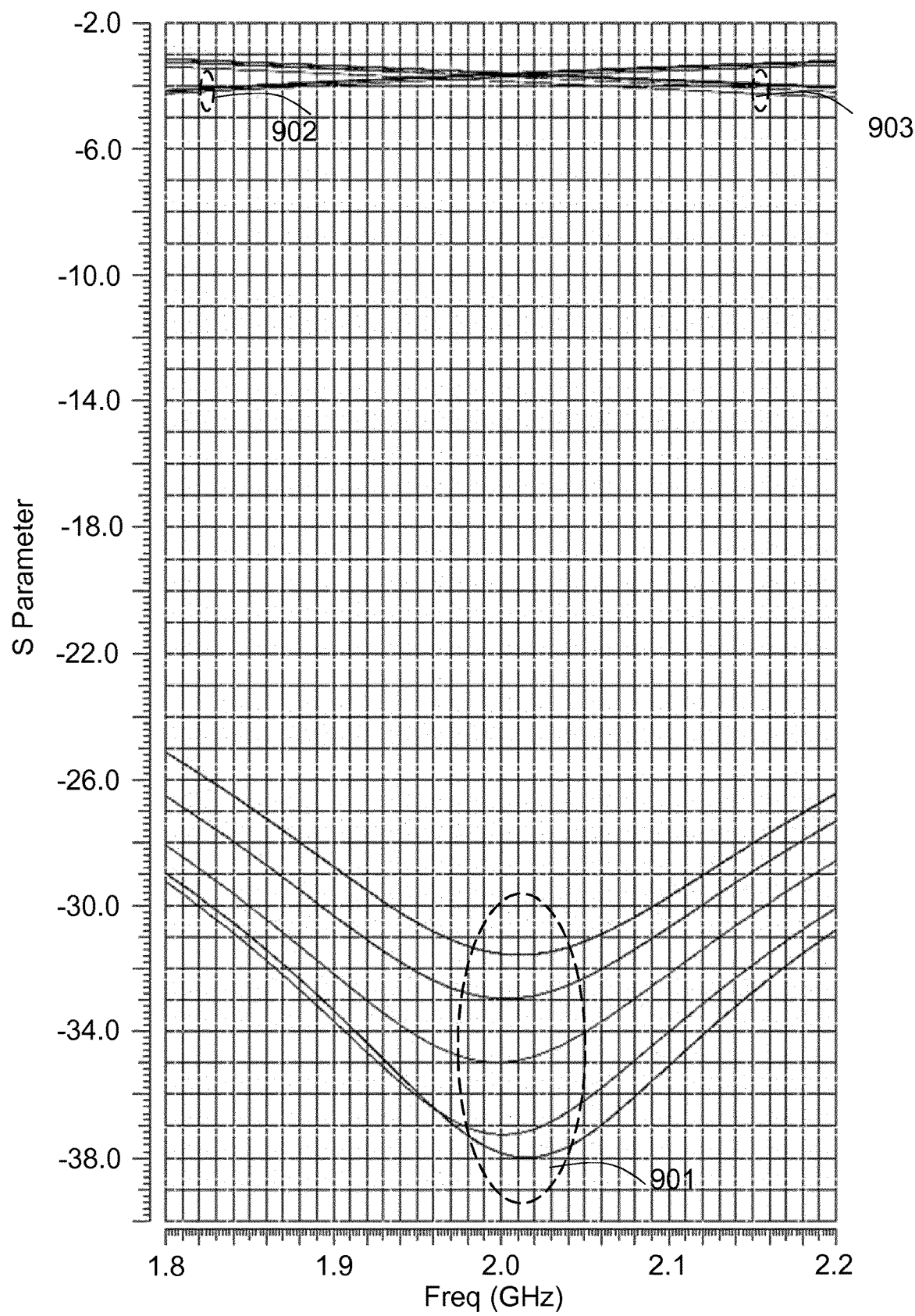
FIG. 9 shows simulation results for the differential combiner shown in FIG. 7 with non-ideal inductors.

FIG. 9 shows simulation results for non-ideal inductors having Q=10. The isolation capacitors value has been adjusted to keep the peak isolation for the signal with frequency at 2 GHz. The curves marked by the oval shape 901 are S31 curves for different antenna impedances 100−j40Ω, 100−j20Ω, 100Ω, 100+j20Ω, 100+j40Ω. The curves marked by the oval shape 902 are S21 curves, and by the oval shape 903 are S32 curves. As can be seen some isolation performance is lost, but more precise tuning may be performed on both real and imaginary part of the of the isolation impedance of the differential combiner circuit 700, tuning both the isolation resistors and capacitors to obtain higher narrow-band cancellation. As expected the losses have also increased. The loss at the center frequency for an inductor Q of 10 is about 3.7 dB. This should be compared to the loss in the ideal case, which is equal to 3 dB. The additional loss using an on-chip inductor is thus about 0.7 dB. It should also be noted that it may be possible to realized higher Q-values than 10 on chip, depending on frequency, semiconductor process, and available chip area. The loss will then be between 3 dB and 3.7 dB.

Figure 10:
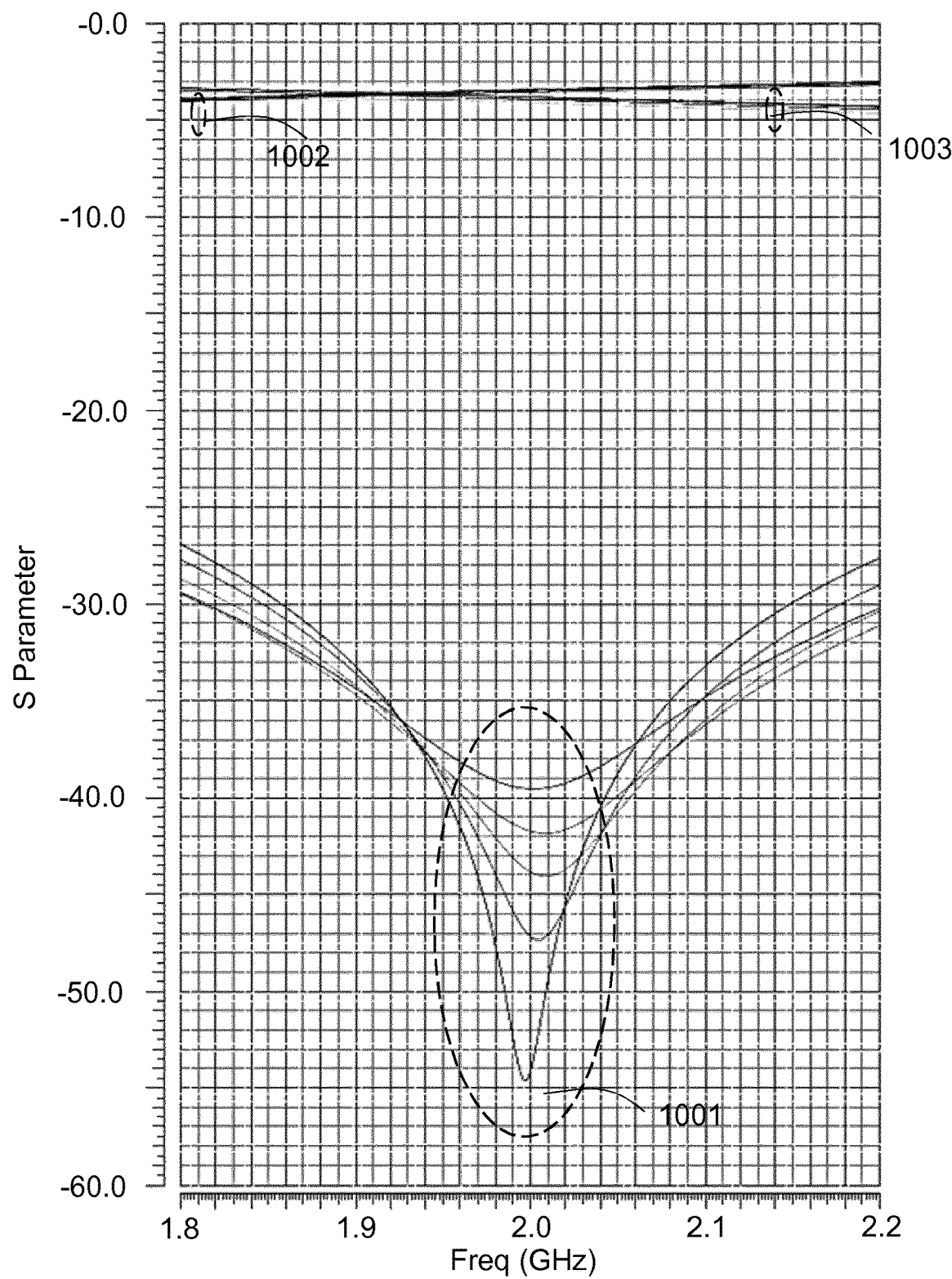
FIG. 10 shows simulation results for the differential combiner shown in FIG. 7 with more fine-tuned settings of circuit parameters.

FIG. 10 shows the result after some more fine tuning to increase isolation. Here the capacitors in the differential combiner 700 have each been increased by 9%. The isolation capacitors have been calculated with an extra j3Ω in Zant when applying equation (6), and an additional 4Ω has been added to the isolation resistors. The curves marked by the oval shape 1001 are S31 curves for different antenna impedances 100−j40Ω, 100−j20Ω, 100Ω, 100+j20Ω, 100+j40Ω. The curves marked by the oval shape 1002 are S21 curves, and by the oval shape 1003 are S32 curves. As can be seen from FIG. 10, it is possible to achieve high isolation also with non-ideal on-chip inductors.

Deviations in antenna impedance will affect the isolation, since the magnitude and phase of the current from the transmitter to the receiver port is affected. To compensate for this the resistance in the isolation path may be made programmable, and two sets of programmable capacitors may be used, one cross-coupled and one without cross-coupling. In that way both capacitive and inductive loads may be handled with high isolation without using any additional inductors in the differential combiner circuit 100, 200, 700. Furthermore, the center or resonance frequency of the differential combiner circuit 100, 200, 700 may also be tuned by using programmable inductors and capacitors.

Therefore, according to some embodiments herein, the resistances of the first and second resistors R1, R2 may be variable or programmable.

The capacitance of the first, second and third capacitors C1, C2, C3 may be variable or programmable.

The inductance of the first, second and third inductors L1, L2, L3 may be variable or programmable.

The set of cross-coupled capacitors Cc1, Cc2 may be variable or programmable.

The set of non-cross-coupled capacitors Cnc1, Cnc2 may be variable or programmable.

To summarize, when the differential combiner 100, 200, 700 is in operation, a received signal at the antenna port, i.e. the second port 2a, 2b, will result in opposite phase signals at the first port 1a, 1b and third port 3a, 3b, if the frequency of the signal is equal to the resonance frequency of the differential combiner circuit 100, 200, 700. The resulting signals at 1a and 3b will then be in phase, so there will be no voltage between the terminals of the first resistor R1 due to the received signal. In the same way there will be no voltage between 1b and 3a and no voltage over the second resistor R2. The isolation resistors R1, R2 will thus have no effect on the signals in this case. The received signal power will then split equal between the receive and transmit ports, half the power ending up in the receive port, corresponding to the usual loss of 3 dB in an isolating combiner.

When a signal is injected by the transmitter, at the differential transmit port, the signal is isolated from the receive port. This occurs due to a cancellation between two paths, one through the LC-structure and one through the resistors. As explained above, when the receive port is to be isolated, it should have zero signal voltage, and thus can be seen as a signal ground. Then the signal currents from the two paths caused by a voltage at the transmitter port are checked. With a resistive antenna impedance and operating at the LC resonance frequency, there will be zero phase shift of the transfer from the transmit port voltage to the receive port current. With the cross coupled resistors there will be 180 degrees phase shift. Then by selecting the resistance value so that the magnitude of the two branch currents match, there will be a cancellation, hence isolating the receive port from the transmitter at the resonance frequency. The transmitter power will be shared equally between the resistors and the antenna port, having a 3 dB loss also for the signal transfer from the transmitter to the antenna.

The differential combiner circuit 100, 200, 700 may be used in a transceiver for full duplex or frequency division duplex. The second port of the differential combiner circuit 100, 200, 700 may serve as an antenna port coupled to an antenna. The first port of the differential combiner circuit 100, 200, 700 may serve as a receive port coupled to a receiver and the third port of the differential combiner circuit 100, 200, 700 may serve as a transmit port coupled to a transmitter or vice versa.

Figure 11:
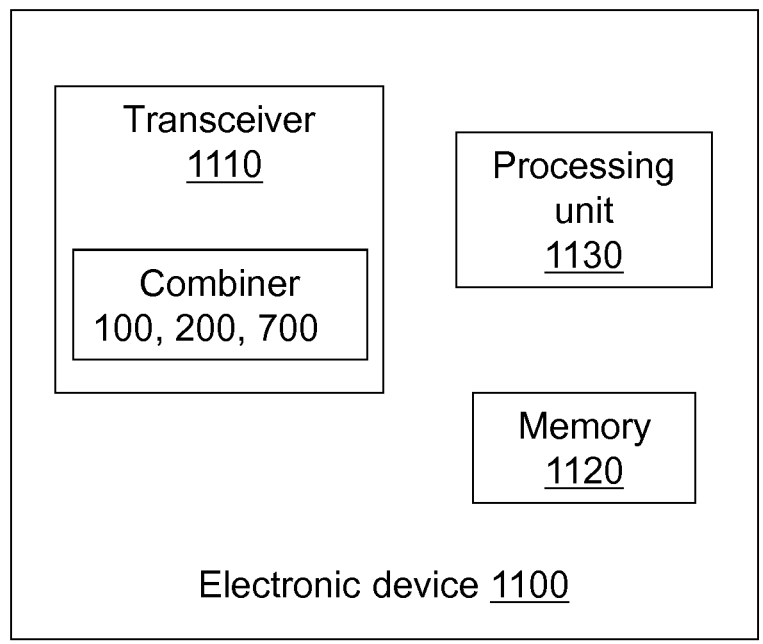
FIG. 11 is a block diagram illustrating an electronic device in which a transceiver according to embodiments herein may be implemented.

The differential combiner circuit 100, 200, 700 may be employed in various integrated circuits, electronic circuits, devices or apparatus. FIG. 11 shows a block diagram for an electronic device 1100. The electronic device 1100 comprises a transceiver 1110 which comprises the differential combiner circuit 100, 200, 700. The electronic device 1100 may comprise other units, where a memory 1120, a processing unit 1130 are shown. The electronic device 1100 may be a user equipment or a mobile device, a wireless communication device, or a radio base station for a cellular communication system.

The differential combiner circuit 100, 200, 700 according to the embodiments herein provides wide bandwidth, avoids use of transmission lines and transformers, and does not require a dummy load with programmable inductance. Despite its simplicity and low component count it supports fully differential circuitry, and it provides high isolation between receiver and transmitter. The differential combiner circuit is suitable for full integration as an on-chip isolator and provides low additional loss with low quality factor on-chip inductors. With an on-chip isolator like this, it becomes feasible to introduce full duplex or flexible frequency division duplex in low-cost short-range transceivers.

Those skilled in the art will understand that the differential combiner circuit 100, 200, 700 according to embodiments herein may be implemented by any semiconductor technology, e.g. Bi-polar, NMOS, PMOS, CMOS or Micro-Electro-Mechanical Systems (MEMS) technology etc.

The word "comprise" or "comprising", when used herein, shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. A differential combiner circuit, comprising:
   a first port having a first terminal and a second terminal;
   a second port having a first terminal and a second terminal;
   a third port having a first terminal and a second terminal;
   a first sub-circuit comprising:
      a first inductor connected between the first terminals of the first and second ports; and
      a first capacitor connected between the first terminals of the second and third ports;
   a second sub-circuit comprising:
      a second inductor connected between the second terminals of the first and second ports; and
      a second capacitor connected between the second terminals of the second and third ports;
   a third capacitor connected between the first and second terminals of the first port;
   a third inductor connected between the first and second terminals of the third port;
   a first resistor connected between the first terminal of the first port and the second terminal of the third port; and
   a second resistor connected between the second terminal of the first port and the first terminal of the third port.

2. The differential combiner circuit of claim 1, wherein resistances of the first and second resistors are variable or programmable.

3. The differential combiner circuit of claim 1, wherein the capacitance of the first, second, and third capacitors are variable or programmable.

4. The differential combiner circuit of claim 1, wherein the inductance of the first, second, and third inductors are variable or programmable.

5. The differential combiner circuit of claim 1, further comprising a set of variable or programmable capacitors in parallel with the first and second resistors.

6. The differential combiner circuit of claim 1, further comprising a set of variable or programmable capacitors, one of the set of variable or programmable capacitors between the first terminal of the first port and the first terminal of the third port, and one of the set of variable or programmable capacitors between the second terminal of the first port and the second terminal of the third port.

7. A transceiver for full duplex or frequency division duplex communications, comprising:
   a differential combiner circuit, the differential combiner circuit comprising:
      a first port having a first terminal and a second terminal;
      a second port having a first terminal and a second terminal;
      a third port having a first terminal and a second terminal;
      a first sub-circuit comprising:
         a first inductor connected between the first terminals of the first and second ports; and
         a first capacitor connected between the first terminals of the second and third ports;
      a second sub-circuit comprising:
         a second inductor connected between the second terminals of the first and second ports; and
         a second capacitor connected between the second terminals of the second and third ports;
      a third capacitor connected between the first and second terminals of the first port;
      a third inductor connected between the first and second terminals of the third port;
      a first resistor connected between the first terminal of the first port and the second terminal of the third port; and
      a second resistor connected between the second terminal of the first port and the first terminal of the third port;
   wherein the second port of the differential combiner circuit serves as an antenna port coupled to an antenna; and
   wherein either:

the first port of the differential combiner circuit serves as a receive port coupled to a receiver and the third port of the differential combiner circuit serves as a transmit port coupled to a transmitter; or the third port of the differential combiner circuit serves as the receive port coupled to the receiver and the first port of the differential combiner circuit serves as the transmit port coupled to the transmitter.

8. The transceiver of claim 7, wherein resistances of the first and second resistors are variable or programmable.

9. The transceiver of claim 7, wherein the capacitance of the first, second, and third capacitors are variable or programmable.

10. The transceiver of claim 7, wherein the inductance of the first, second, and third inductors are variable or programmable.

11. The transceiver of claim 7, wherein the differential combiner circuit further comprising a set of variable or programmable capacitors in parallel with the first and second resistors.

12. The transceiver of claim 7, wherein the differential combiner circuit comprises a set of variable or programmable capacitors, one of the set of variable or programmable capacitors between the first terminal of the first port and the first terminal of the third port, and one of the set of variable or programmable capacitors between the second terminal of the first port and the second terminal of the third port.

13. A communication device, comprising:
a transceiver for full duplex or frequency division duplex communications and having a differential combiner circuit, the differential combiner circuit comprising:
  a first port having a first terminal and a second terminal;
  a second port having a first terminal and a second terminal;
  a third port having a first terminal and a second terminal;
  a first sub-circuit comprising:
    a first inductor connected between the first terminals of the first and second ports; and
    a first capacitor connected between the first terminals of the second and third ports;
  a second sub-circuit comprising:
    a second inductor connected between the second terminals of the first and second ports; and
    a second capacitor connected between the second terminals of the second and third ports;
  a third capacitor connected between the first and second terminals of the first port;
  a third inductor connected between the first and second terminals of the third port;
  a first resistor connected between the first terminal of the first port and the second terminal of the third port; and
  a second resistor connected between the second terminal of the first port and the first terminal of the third port;
wherein the second port of the differential combiner circuit serves as an antenna port coupled to an antenna; and
wherein either:
  the first port of the differential combiner circuit serves as a receive port coupled to a receiver and the third port of the differential combiner circuit serves as a transmit port coupled to a transmitter; or
  the third port of the differential combiner circuit serves as the receive port coupled to the receiver and the first port of the differential combiner circuit serves as the transmit port coupled to the transmitter.

14. The communication device of claim 13, wherein resistances of the first and second resistors are variable or programmable.

15. The communication device of claim 13, wherein the capacitance of the first, second, and third capacitors are variable or programmable.

16. The communication device of claim 13, wherein the inductance of the first, second, and third inductors are variable or programmable.

17. The communication device of claim 13, wherein the differential combiner circuit comprises a set of variable or programmable capacitors in parallel with the first and second resistors.

18. The communication device of claim 13, wherein the differential combiner circuit comprises a set of variable or programmable capacitors, one of the set of variable or programmable capacitors between the first terminal of the first port and the first terminal of the third port, and one of the set of variable or programmable capacitors between the second terminal of the first port and the second terminal of the third port.

* * * * *

UNITED STATES PATENT AND TRADEMARK OFFICE
CERTIFICATE OF CORRECTION

PATENT NO. : 11,909,372 B2
APPLICATION NO. : 17/426252
DATED : February 20, 2024
INVENTOR(S) : Henrik Sjöland Page 1 of 1

It is certified that error appears in the above-identified patent and that said Letters Patent is hereby corrected as shown below:

In the Specification

In Column 5, Line 57, delete "$R_{port}$=1000." and insert -- $R_{port}$=100Ω. --, therefor.

In Column 7, Line 51, delete "3.50," and insert -- 3.5Ω, --, therefor.

Signed and Sealed this
Eighteenth Day of February, 2025

Coke Morgan Stewart
*Acting Director of the United States Patent and Trademark Office*